United States Patent
Tohyama

(10) Patent No.: US 9,043,175 B2
(45) Date of Patent: May 26, 2015

(54) ELECTRONIC APPARATUS

(75) Inventor: Kei Tohyama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 1037 days.

(21) Appl. No.: 13/114,985

(22) Filed: May 24, 2011

(65) Prior Publication Data

US 2011/0221395 A1    Sep. 15, 2011

Related U.S. Application Data

(63) Continuation of application No. 12/020,680, filed on Jan. 28, 2008, now Pat. No. 7,974,795.

(30) Foreign Application Priority Data

Feb. 5, 2007  (JP) ................. 2007-025531

(51) Int. Cl.
G01R 31/36    (2006.01)
(52) U.S. Cl.
CPC .......... *G01R 31/361* (2013.01); *G01R 31/3648* (2013.01)

(58) Field of Classification Search
CPC ............. G01R 31/361; G01R 31/3648; G01R 31/3651; G01R 31/3655
USPC ......... 702/60, 63–65; 324/427, 431; 320/127, 320/132; 340/636.1, 636.12, 636.13, 340/636.15
See application file for complete search history.

(56) References Cited

U.S. PATENT DOCUMENTS 5,592,094 A * 1/1997 Ichikawa ................. 324/427
2007/0005276 A1* 1/2007 Cho et al. .................. 702/60

* cited by examiner

*Primary Examiner* — Manuel L Barbee
(74) *Attorney, Agent, or Firm* — Canon U.S.A. Inc., IP Division

(57) ABSTRACT

When discharge power calculated based on a current value detected by a current detector is smaller than expected maximum power, which is the maximum power expected in an actual operation, a discharge efficiency at the expected maximum power is set as a discharge efficiency used for remaining capacity calculation. This ensures that a remaining capacity based on power required for a photographing operation can be detected.

17 Claims, 12 Drawing Sheets

ELECTRONIC APPARATUS

CROSS-REFERENCE TO RELATED APPLICATIONS

This application is a continuation application of U.S. Ser. No. 12/020,680 filed Jan. 28, 2008 which claims priority to Japanese Application Serial No. 2007-025531, filed Feb. 5, 2007, all of which the contents of are hereby incorporated by reference in their entirety.

BACKGROUND OF THE INVENTION

1. Field of the Invention

The present invention relates to an electronic apparatus for detecting a remaining battery capacity, and a method for controlling the electronic apparatus.

2. Description of the Related Art

In the related art, a technique for detecting a remaining battery capacity is disclosed in, for example, Japanese Patent Laid-Open No. 2002-298932. A device disclosed in Japanese Patent Laid-Open No. 2002-298932 includes a temperature detector for detecting a voltage, discharge current, and temperature of a battery, and a storage unit for storing a charge capacity of the battery that is fully charged. The device further includes a current integrating unit for integrating the detected discharge current, and a calculation unit for calculating a remaining capacity of the battery. The calculation unit first determines a discharge efficiency for discharge characteristics of the battery on the basis of the detected temperature, current, and voltage (power) (see FIG. 7).

The calculation unit then subtracts the integrated current from the product of the stored charge capacity and the discharge efficiency to calculate a remaining capacity, and obtains the resulting value as the remaining capacity of the battery in the current temperature and discharge power conditions. That is, in the remaining-battery-capacity detection technique of the related art, when the discharge efficiency changes with battery power and temperature, a remaining battery capacity is calculated using the current power and temperature and is displayed.

However, as shown in FIG. 2, cameras such as digital cameras have a difference on the order of several times to dozens of times between power P0 determined when the cameras are started and a remaining battery capacity is detected before the start of a photographing operation (a period from time T0 to time T1 shown in FIG. 2) and maximum power PM1 determined during the photographing operation (a period from time T3 to time T6 shown in FIG. 2). Such existing cameras having a large difference between the power determined during a photographing operation and the power determined before the start of the photographing operation have experienced the following problems.

A first problem is as follows. As described above, in the related art, when the discharge efficiency changes with battery power and temperature, a remaining battery capacity is calculated using the current power and temperature and is indicated to a user. Thus, before a photographing operation is started, a remaining battery capacity is detected and the user is notified that the discharge efficiency is high and the remaining capacity is sufficient. During the photographing operation, however, the power increases and the discharge efficiency decreases, resulting in the possibility of discharge failure.

This problem will now be specifically described with respect to examples shown in FIGS. 2 and 7. In the period from time T0 to time T1 shown in FIG. 2 (before the start of a photographing operation), a remaining battery capacity is detected and the power P0 is indicated to the user as the remaining capacity. Since the discharge efficiency at the power value P0 for a temperature of −20° C. is 97%, it is determined that the discharge efficiency is high and the remaining capacity is sufficient. In the period from time T3 to time T6 shown in FIG. 2 (during the photographing operation), however, the power increases and the discharge efficiency decreases. In particular, at the maximum power PM1 for a period from time T4 to time T5, the discharge efficiency for a temperature of −20° C. is 72%, resulting in the possibility of discharge failure.

For example, it is assumed that the temperature is −20° C., the charge capacity of the fully charged battery is 2000 mAh, the integrated discharge capacity is 400 mAh, the power P0 is 1 W, and the maximum power PM1 is 12 W. In this case, referring to FIG. 7, the discharge efficiency at a power of 1 W is 97%, and the remaining capacity is given as:

$$\text{Remaining capacity (1 W)} = (2000 \times 97/100 - 400)$$
$$= 1540 \text{ mAh}$$

Referring to FIG. 7, further, the discharge efficiency at a power of 12 W is 72%, and the remaining capacity is given as:

$$\text{Remaining capacity (12 W)} = (2000 \times 72/100 - 400)$$
$$= 1040 \text{ mAh}$$

Another problem occurs with an arrangement in which a minimum remaining capacity due to changes in temperature or power in use is stored and a remaining battery capacity is displayed based on the minimum remaining capacity.

Even though it is determined that there is no remaining capacity in a battery check with the power determined during a photographing operation, if the same battery is attached, there arises a problem in that due to a battery check under the condition of lower power, it is erroneously determined that battery life seems to be left. Further, if the communication interval between remaining capacity checks is long, a time lag is caused between the storage of the minimum remaining capacity and the reading thereof by the apparatus, and it is difficult to detect a remaining capacity at the maximum power point. This does not provide an accurate indication of remaining capacity.

SUMMARY OF THE INVENTION

According to an aspect of the present invention, it is determined whether or not a discharge power value calculated from a discharge current value detected by a discharge current detecting unit and a voltage value detected by a battery voltage detecting unit is smaller than a predetermined specified power value; and a discharge efficiency is calculated from the specified power value and a detection result of a temperature detecting unit when it is determined that the calculated discharge power value is smaller than the specified power value, and a discharge efficiency is calculated from the calculated discharge power value and the detection result of the temperature detecting unit when it is determined that the calculated discharge power value is greater than the specified power value.

Other aspects and features of the present invention will become apparent from the following description and the attached drawings.

DESCRIPTION OF THE EMBODIMENTS

Figure 1:
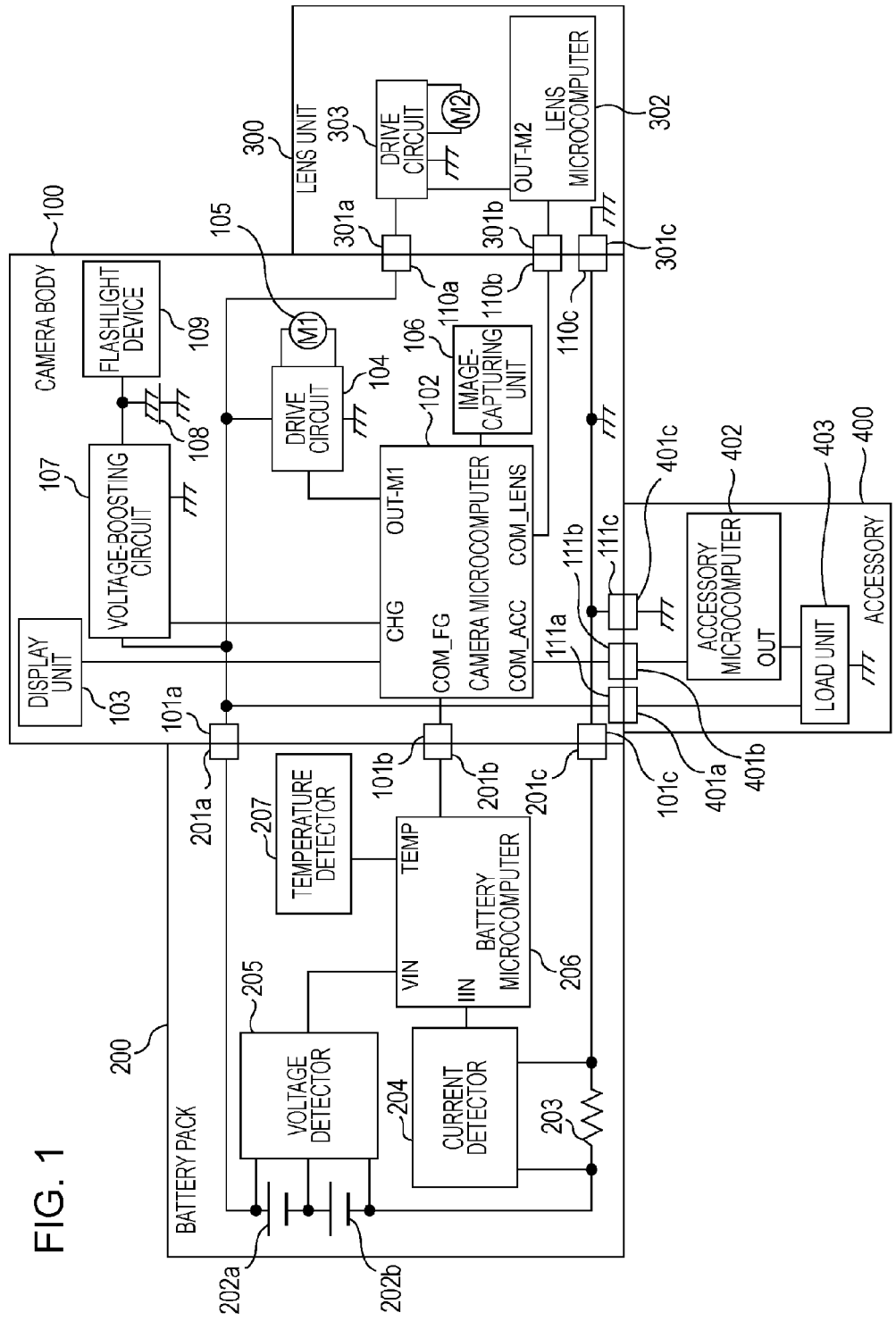
FIG. 1 is a block diagram showing an example structure of a camera including a remaining-battery-capacity detection device according to a first embodiment of the present invention.

Exemplary embodiments of the present invention will be described hereinafter with reference to the drawings.
First Exemplary Embodiment FIG. 1 is a block diagram showing an example structure of a camera including a remaining-battery-capacity detection device according to a first embodiment of the present invention.

The camera includes a camera body 100 which is connected to a battery pack 200, a lens unit 300, and an accessory 400. The camera body 100 is connected to the battery pack 200 provided with a remaining-battery-capacity detection device of the present invention via connection terminals 101a, 101b, and 101c. The connection terminal 101a is connected to a positive terminal (connection terminal) 201a of the battery pack 200, and the connection terminal 101b is connected to a communication terminal 201b of the battery pack 200. The connection terminal 101c is connected to a negative terminal (connection terminal) 201c of the battery pack 200.

The camera body 100 is further connected to the lens unit 300 via connection terminals 110a, 110b, and 110c. The connection terminal 110a is a terminal adapted to apply power to the lens unit 300 through the positive terminal 201a of the battery pack 200 or a DC/DC converter, and is connected to a terminal 301a of the lens unit 300. The connection terminal 101b is a terminal adapted to connect a communication terminal COM_LENS of a camera microcomputer 102 to a communication terminal of the lens microcomputer 302, and is connected to a terminal 301b of the lens unit 300. The connection terminal 110c is a terminal connected to the negative terminal 201c of the battery pack 200, and is connected to a terminal 301c of the lens unit 300. Although the lens unit 300 is configured to be connected to the camera body 100, the camera body 100 and the lens unit 300 may be integrated into a single unit.

The camera body 100 is further connected to the accessory 400 via connection terminals 111a, 111b, and 111c. The connection terminal 111a is a terminal adapted to apply power to the accessory 400 via the positive terminal 201a of the battery pack 200 or the DC/DC converter, and is connected to a terminal 401a of the accessory 400. The connection terminal 111b is a terminal adapted to connect a communication terminal COM_ACC of the camera microcomputer 102 to a communication terminal of an accessory microcomputer 402, and is connected to a terminal 401b of the accessory 400. The connection terminal 111c is a terminal connected to the negative terminal 201c of the battery pack 200, and is connected to a terminal 401c of the accessory 400.

The camera body 100 includes the camera microcomputer 102, a display unit 103, a drive circuit 104 for driving a motor (M1) 105, an image-capturing unit 106, a voltage-boosting circuit 107, a capacitor 108, and a flashlight device 109.

The camera microcomputer 102 is a microcomputer configured to control the operation of each of the elements of the camera body 100, and serving as a communication unit adapted to communicate with the battery pack 200. The display unit 103 displays a remaining battery capacity and various settings of the camera body 100. A source of power of the drive circuit 104 is connected to the positive terminal 201a of the battery pack 200, and the drive circuit 104 drives the motor 105 according to a signal from a terminal OUT-M1 of the camera microcomputer 102. Although the source of power of the drive circuit 104 is connected to the positive terminal 201a of the battery pack 200, power may be supplied via the DC/DC converter.

The motor 105 allows a spring to be charged to drive a shutter mechanism (not shown) of the camera, and allows a quick return mirror of a single lens reflex (SLR) camera to move up and down. The camera microcomputer 102 may have a plurality of terminals OUT-M1, and may be configured to rotate the motor 105 in the forward or reverse direction.

The image-capturing unit 106 is a known image-capturing unit including an image pickup element, etc. The voltage-boosting circuit 107 is powered from the positive terminal 201a of the battery pack 200, and is started to operate by a signal from a terminal CHG of the camera microcomputer 102 to store an electric charge corresponding to a boosted voltage in the capacitor 108. The flashlight device 109 discharges the electric charge in the capacitor 108 to illuminate an object during a photographing operation.

The battery pack 200 includes battery cells 202a and 202b such as secondary battery cells, a current detecting resistor 203, a current detector 204, a current detector 205, a battery microcomputer 206, and a temperature detector 207.

The battery cells 202a and 202b are connected in series, and the current detecting resistor 203 is connected between the battery cell 202b and the connection terminal 201c. The current detecting resistor 203 may be connected between the positive terminal of the battery cell 202a and the connection terminal 201a.

The current detector 204 detects a current charged and discharged by the battery cells 202a and 202b using the current detecting resistor 203, and an output of the current detector 204 is supplied to a terminal IIN of the battery microcomputer 206, which is an analog-to-digital (A/D) conversion terminal. The battery microcomputer 206 is a microcomputer configured to perform processing such as the measurement and integration of current from the current detector 204, the storage of the charge capacity of the battery cells 202a and 202b that are fully charged, and the communication with the camera microcomputer 102.

The voltage detector 205 detects a voltage of the battery cells 202a and 202b, and an output of the voltage detector 205 is supplied to a terminal VIN of the battery microcomputer 206, which is an A/D conversion terminal. The temperature detector 207 detects a temperature of the battery cell 202a or 202b or a temperature of the inside of the battery pack 200, and an output of the temperature detector 207 is supplied to an A/D conversion terminal TEMP of the battery microcomputer 206.

Although two battery cells, namely, the battery cells 202a and 202b, are provided, more than two battery cells may be provided. Further, the current detector 204, the current detector 205, etc., may be incorporated in the battery microcomputer 206. The current may be integrated using an existing technique such as A/D conversion of current at predetermined intervals and calculation by the battery microcomputer 206, or using a coulomb counter.

The lens unit 300 includes a drive circuit 303 for driving a motor M2, the lens microcomputer 302, a focusing lens (not shown), and an aperture unit (not shown). The drive circuit 303 drives the motor M2 in response to supply of power from the connection terminal 301a, and drives the focusing lens. The lens microcomputer 302 is a microcomputer configured to perform various operations of the lens unit 300, and is configured to drive the focusing lens or the aperture unit in response to communication from the camera microcomputer 102. A plurality of communication lines may be provided between the camera microcomputer 102 and the lens microcomputer 302.

The accessory 400 includes a load unit 403 to which power is supplied from the connection terminal 401a, and the accessory microcomputer 402. The accessory microcomputer 402 is a microcomputer configured to perform various operations of the accessory 400, and is configured to control the operation of the load unit 403 in response to communication from the camera microcomputer 102. If the accessory 400 is a storage device such as a hard disk drive (HDD), the load unit 403 is formed of a drive circuit for driving a disk of the HDD, and a motor. If the accessory 400 is a flashlight device, the load unit 403 is formed of a light source, or is formed of a drive circuit for driving a light source, and a voltage-boosting circuit.

A plurality of communication lines may be provided between the camera microcomputer 102 and the accessory microcomputer 402.

The operation of the camera microcomputer 102 and the lens microcomputer 302 will now be described with reference to FIG. 2.

Figure 2:
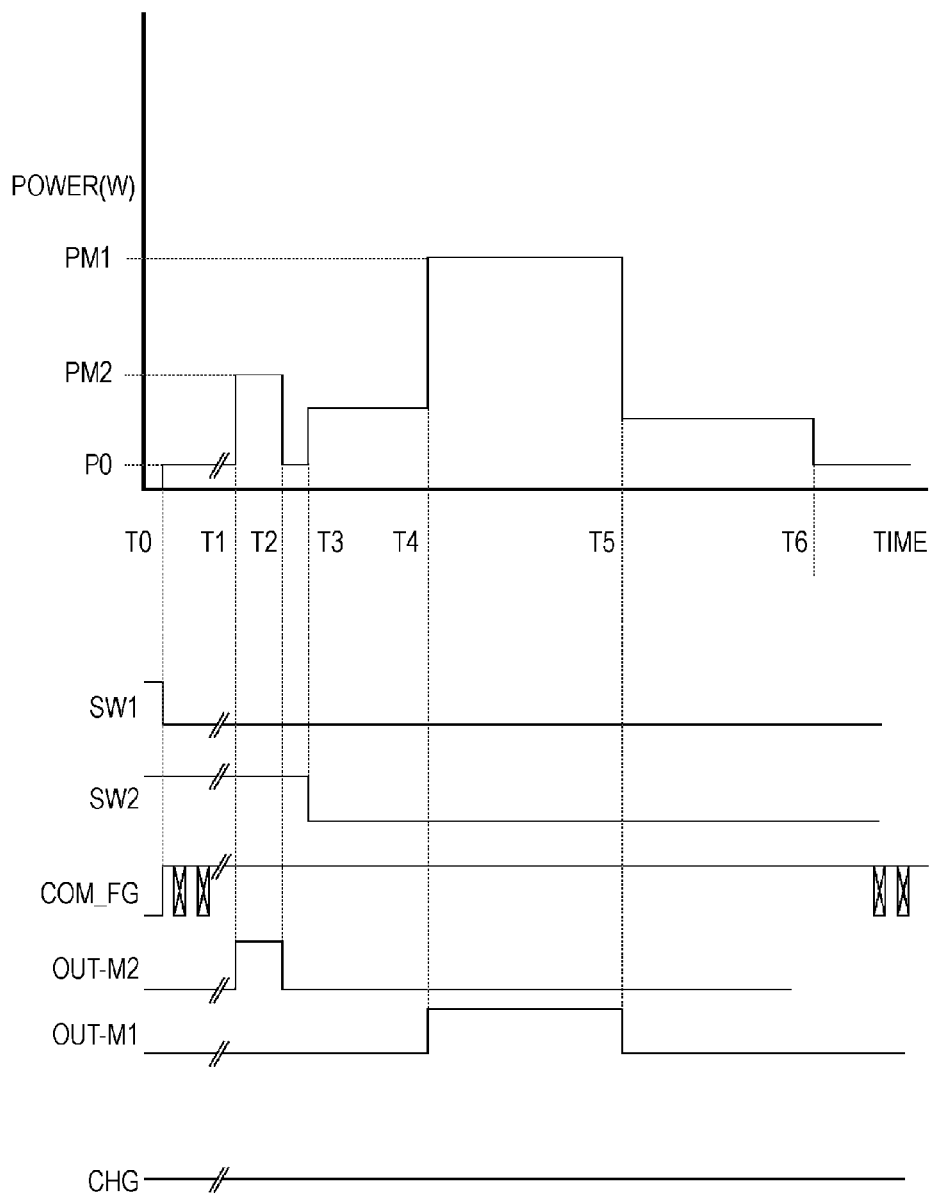
FIG. 2 is a time chart showing an example operation of a camera.

FIG. 2 is a time chart showing an operation of the camera, and shows a relationship among signals of the camera microcomputer 102 and the lens microcomputer 302 to be supplied for a period from the start of the camera to the end of a photographing operation, the power consumption, and the time.

When a release switch (not shown) mounted on the camera body 100 is pressed half way (SW1) (time T0), the camera microcomputer 102 changes its operation mode from a stop mode to an operating mode. As shown in FIG. 2, the power changes from substantially zero (0) to a value P0. The camera microcomputer 102 further changes the signal level of the terminal COM_FG from a low level to a high level, and notifies the battery microcomputer 206 that the camera has been started (time T0).

The camera microcomputer 102 further performs processing such as communicating with the battery microcomputer 206 using the terminal COM_FG to transmit expected maximum power (specified power value), which is the maximum power expected in an actual operation, or transmit a remaining capacity request. The camera microcomputer 102 obtains the remaining capacity of the battery cells 202a and 202b from the transmitted data, and displays it on the display unit 103 (a period from time T0 to time T1).

In a subsequent period from time T1 to time T2, the camera microcomputer 102 communicates with the lens microcomputer 302 for driving the lens for auto-focusing. Then, the lens microcomputer 302 controls a terminal OUT-M2 by an amount corresponding to the transmitted amount of driving to drive the motor M2. Referring to FIG. 2, a value PM2 is determined when the motor M2 is being driven. In the first embodiment, as shown in FIG. 2, for the simplicity of illustration, the driving of the motor M2 is indicated by the terminal OUT-M2 being set to the high level. The motor M2 may be rotated in the forward or reverse direction using a plurality of lines.

At time T3 when the release switch (not shown) is fully pressed (SW2), the driving of the motor 105 is controlled by the terminal OUT-M1 to perform various operations (a period from time T3 to time T5). The various operations may include, for example, the operation of the image-capturing unit 106, the charging of the spring to drive the shutter mechanism (not shown) of the camera, and the up and down movement of the quick return mirror of the SLR camera. In the first embodiment, as shown in FIG. 2, for the simplicity of illustration, like the control of the motor M2, the driving of the motor 105 is indicated by the terminal OUT-M1 being set to the high level.

Thereafter, in a period from time T5 to time T6, post-photographing processing such as developing processing and the display of a photographed image on the display unit 103 is performed, and the photographing operation ends.

After the end of the photographing operation, the camera microcomputer 102 communicates with the battery microcomputer 206 using the terminal COM_FG to obtain the remaining capacity from the transmitted data, and displays the remaining capacity on the display unit 103 (after time T6).

In the foregoing operation, the power consumption increases and decreases in the manner shown in FIG. 2. That is, referring to FIG. 2, the value PM1 determined when the motor 105 is being driven, which is the maximum power, is approximately dozens of times the value P0 determined during the communication between the camera microcomputer 102 and the battery microcomputer 206. The expected maximum power (specified power value) is the expected maximum power stored in the camera microcomputer 102 or a storage unit (not shown). In the first embodiment, the value PM1 is set as the expected maximum power.

The remaining-battery-capacity detection operation of the battery microcomputer 206 will now be described with reference to FIG. 3.

Figure 3:
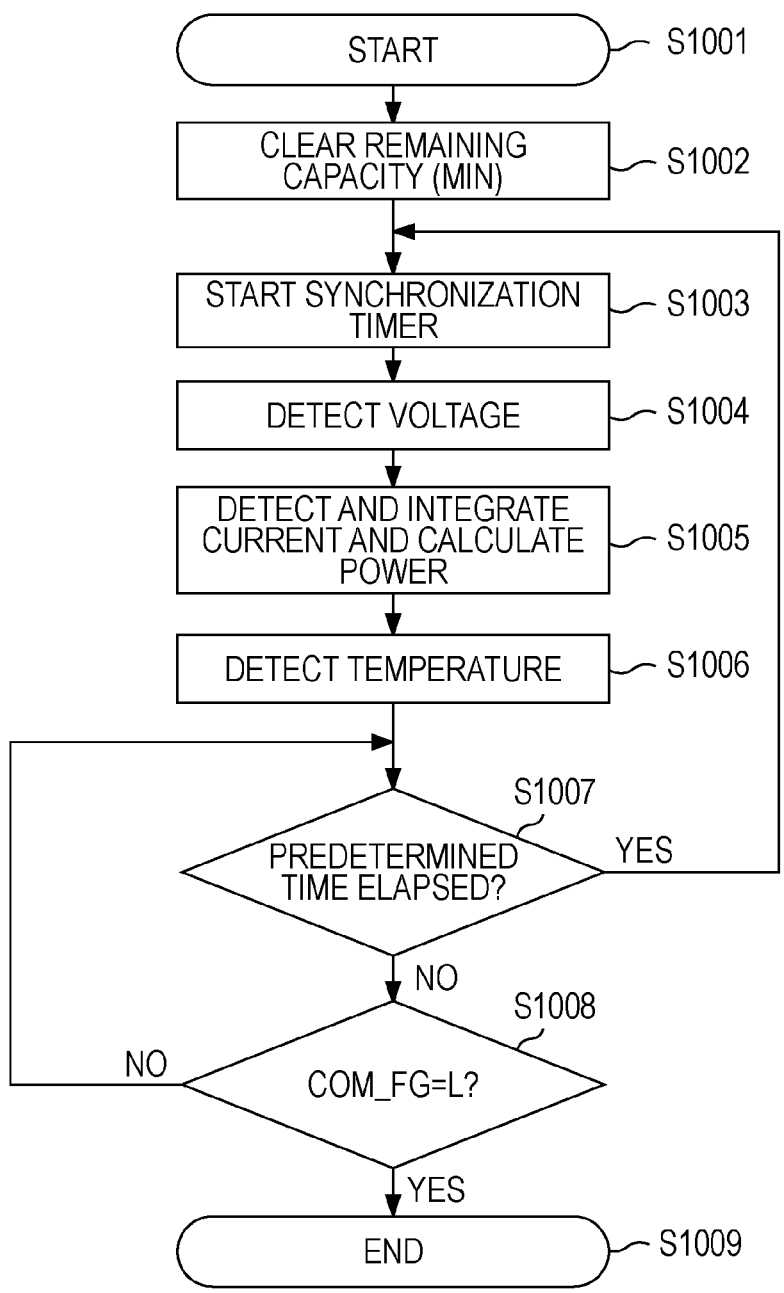
FIG. 3 is a flowchart showing a remaining-battery-capacity detection operation of a battery microcomputer according to the first embodiment.

FIG. 3 is a flowchart showing the remaining-battery-capacity detection operation of the battery microcomputer 206 according to the first embodiment.

When the signal level of the terminal COM_FG of the camera microcomputer 102 is changed from the low level to the high level, the battery microcomputer 206 is started to operate (step S1001). In step S1002, the minimum remaining capacity value (remaining capacity (min)) is cleared. In step S1003, a periodic timer for periodically performing operations including temperature detection, voltage detection, current detection, and current integration is started.

In step S1004, the voltage detector 205 detects a voltage of the battery cells 202a and 202b. In step S1005, the integrated discharge current is calculated from the current detected by the current detecting resistor 203 and the current detector 204, and the discharge power is calculated.

In step S1006, the temperature detector 207 detects a temperature. In step S1007, it is determined whether or not the periodic timer has reached a predetermined value. If a predetermined time has elapsed, the process returns to step S1003; otherwise, the process proceeds to S1008.

In step S1008, it is determined whether or not the terminal COM_FG of the camera microcomputer 102 is in the low level for a predetermined period of time in order to determine whether or not the camera microcomputer 102 has entered the stop mode. If the terminal COM_FG is in the low level for the predetermined period of time, the process proceeds to step S1009; otherwise, the process returns to S1007. In step S1009, the mode of the battery microcomputer 206 is also changed to the stop mode.

Upon receiving communication from the terminal COM_FG of the camera microcomputer 102, the battery microcomputer 206 performs a communication interruption process.

The communication interruption process performed by the battery microcomputer 206 will now be described with reference to FIG. 4.

Figure 4:
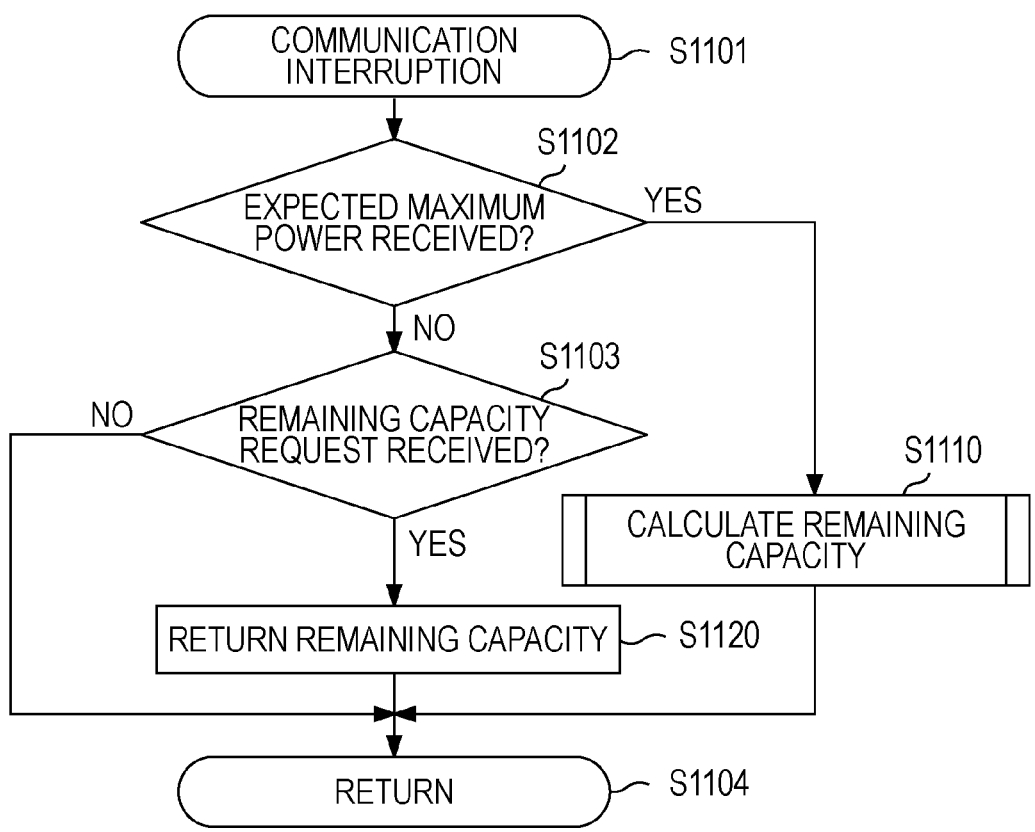
FIG. 4 is a flowchart showing a communication interruption process performed by the battery microcomputer according to the first embodiment.

FIG. 4 is a flowchart showing the communication interruption process performed by the battery microcomputer 206 according to the first embodiment.

First, in step S1101, the communication interruption process starts. In step S1102, it is determined whether or not expected maximum power has been received in the communication with the camera microcomputer 102. If so, the process proceeds to step S1110; otherwise, the process proceeds to step S1103.

In step S1103, it is determined whether or not a remaining capacity request has been received in the communication with the camera microcomputer 102. If so, the process proceeds to step S1120; otherwise, the process proceeds to step S1104. In step S1110, the process proceeds to a remaining capacity calculation subroutine. After the subroutine ends, the process proceeds to step S1104.

In step S1120, the calculated remaining capacity is transmitted from the battery microcomputer 206 to the camera microcomputer 102. Then, the process proceeds to step S1104. In step S1104, the communication interruption process ends.

The operation of the remaining capacity calculation subroutine in step S1110 described above will now be described with reference to FIG. 5.

Figure 5:
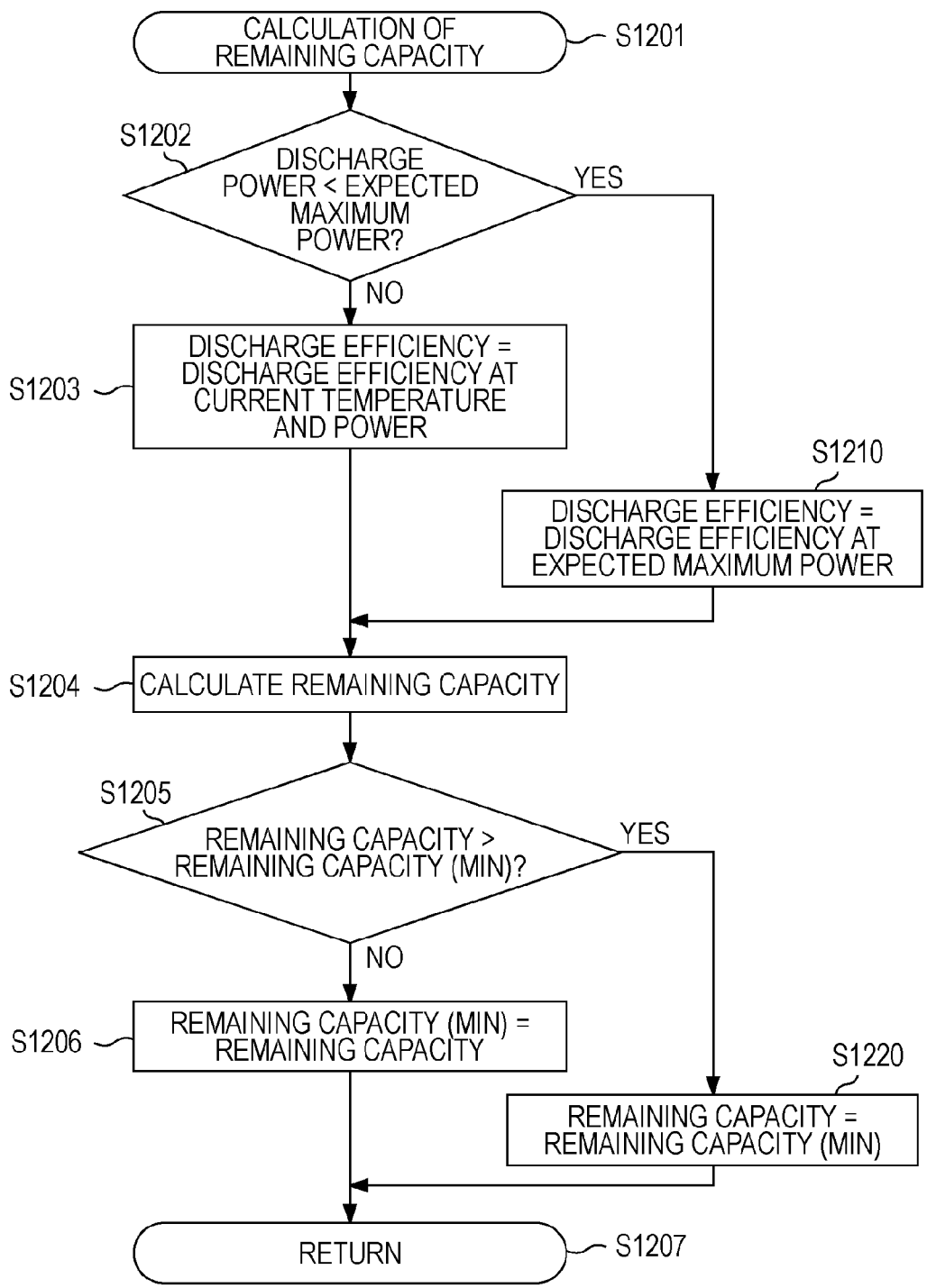
FIG. 5 is a flowchart showing the operation of a remaining capacity calculation subroutine shown in FIG. 4.

FIG. 5 is a flowchart showing the operation of the remaining capacity calculation subroutine shown in FIG. 4.

First, in step S1201, the remaining capacity calculation subroutine starts. In step S1202, the discharge power calculated in step S1005 shown in FIG. 3 is compared with the expected maximum power PM1 transmitted from the camera microcomputer 102. If the discharge power is smaller than the expected maximum power PM1, the process proceeds to step S1210; otherwise, the process proceeds to step S1203.

Figure 7:
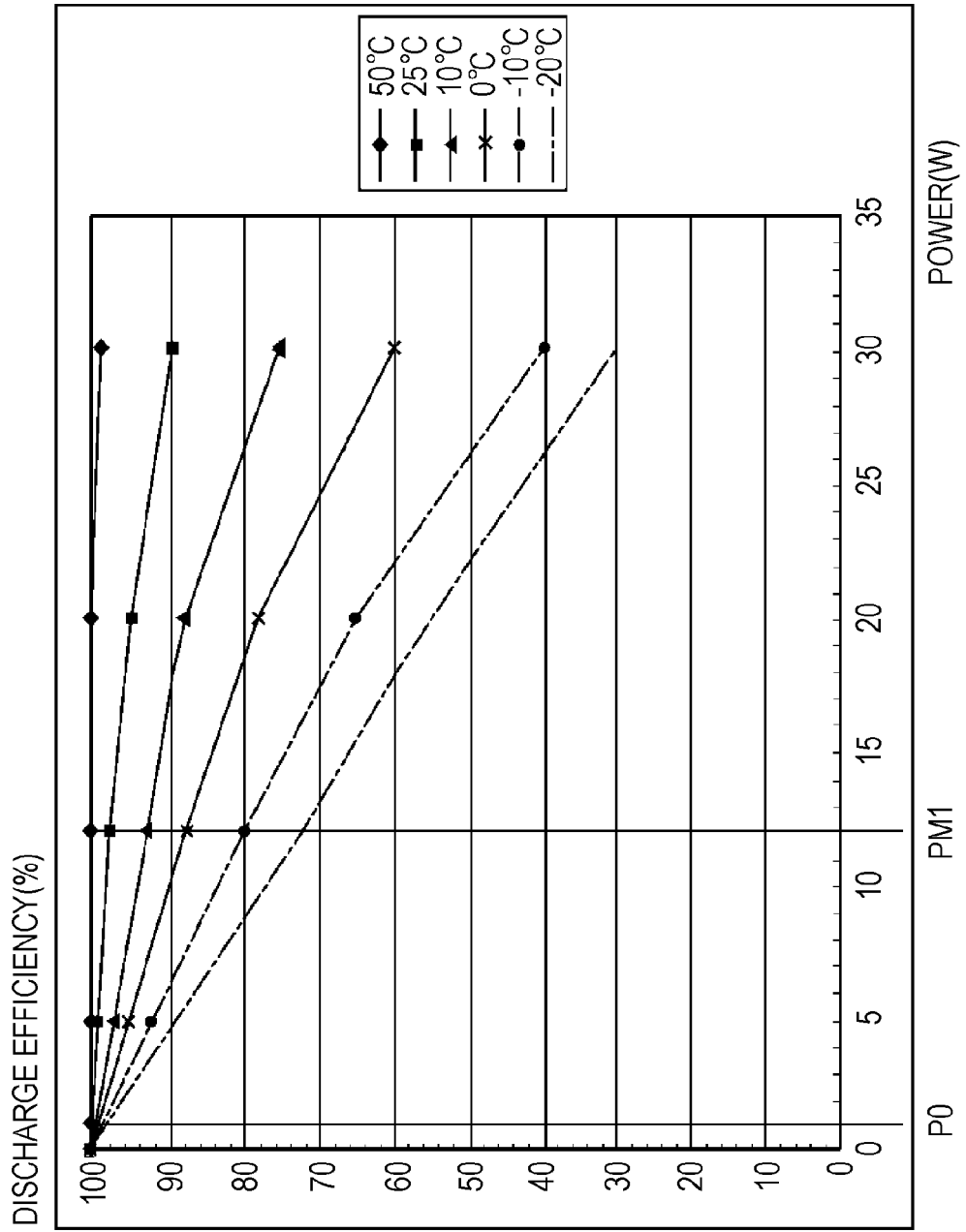
FIG. 7 is a graph showing a relationship between power and temperature of a battery and discharge efficiency.

In step S1203, a discharge efficiency like that shown in FIG. 7, in which discharge characteristics of the battery are reflected, is determined from the temperature detected in step S1006 and the discharge power calculated in step S1005 shown in FIG. 3. The discharge efficiency is determined using an existing calculation method by referring to a table of discharge power and temperature or using a function. Greater discharge power and lower temperature reduce the discharge efficiency.

Figure 6:
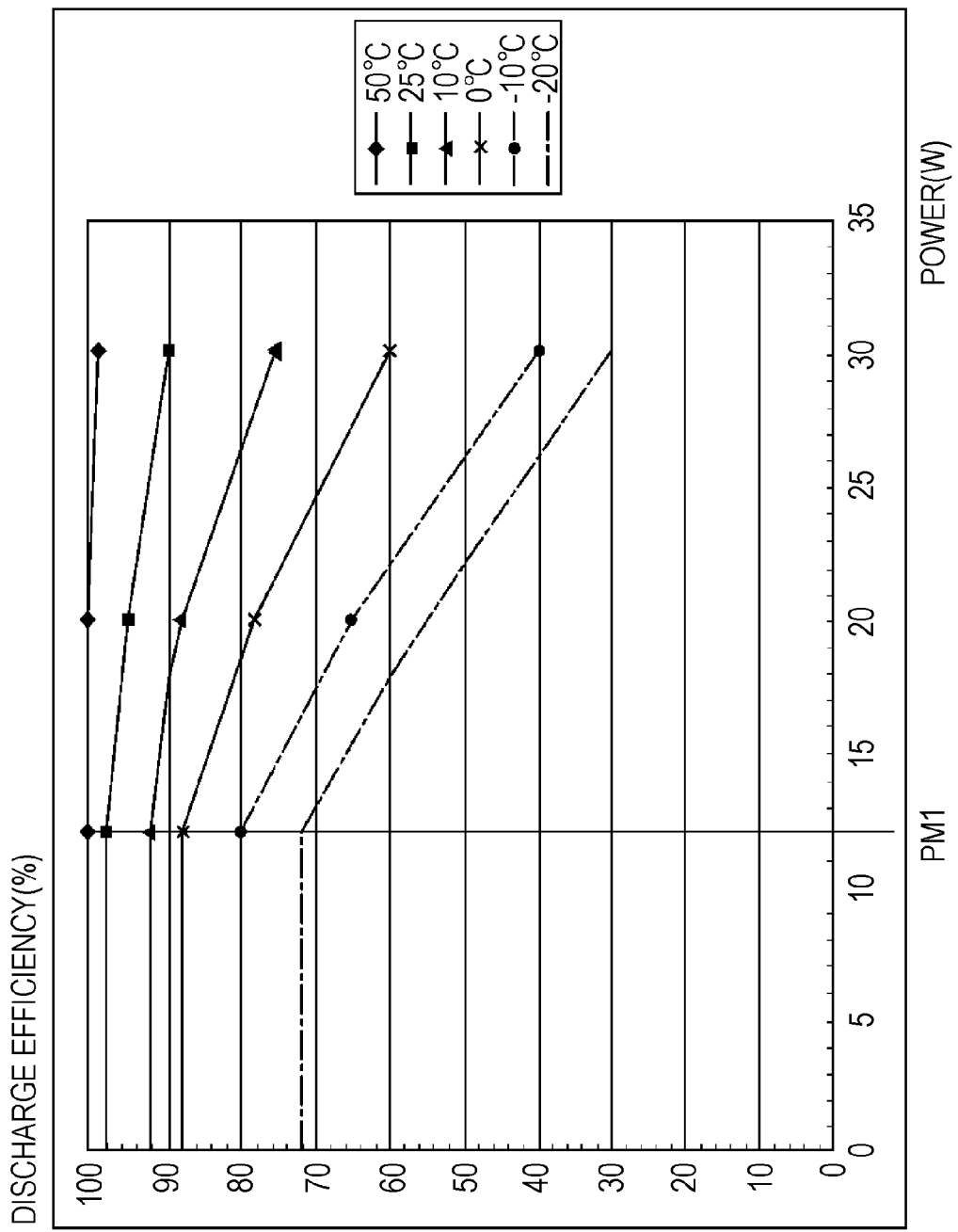
FIG. 6 is a graph showing a relationship between power and temperature of a battery and discharge efficiency according to the present invention.

In step S1210, the discharge efficiency at the expected maximum power PM1 for the temperature detected in step S1006 shown in FIG. 3 is set as a discharge efficiency used for remaining capacity calculation. That is, by performing the processing of steps S1203 and S1210, as shown in FIG. 6, a discharge efficiency having a constant value at power lower than or equal to the value PM1 is obtained.

In step S1204, the remaining capacity of the battery cells 202a and 202b is determined using the following equation:

$$\text{Remaining capacity} = (\text{total capacity} \times \text{discharge efficiency}/100 - \text{discharge capacity}) \quad \text{Eq. (1)}$$

In Eq. (1), the total capacity denotes the total capacity of the battery cells 202a and 202b that are fully charged, which is stored in the battery microcomputer 206 or the storage unit (not shown). The discharge capacity denotes the integrated discharge capacity obtained in step S1005 shown in FIG. 3, and the discharge efficiency denotes the discharge efficiency determined in step S1203 or S1210.

For example, it is assumed that the temperature is −20° C., the total capacity is 2000 mAh, the discharge capacity is 400 mAh, the value P0 indicates a power of 1 W, and the value PM1 indicates a power of 12 W. In this case, referring to the discharge efficiency characteristic shown in FIG. 6, the discharge efficiency at a power of 12 W is 72%. As a result, the remaining capacity is given as:

$$\text{Remaining capacity} = 2000 \times 72/100 - 400)$$

$$= 1040 \text{ mAh}$$

In the related art, on the other hand, as shown in FIG. 7, the discharge efficiency at a power of 1 W is 97%, and the remaining capacity is given as:

$$\text{Remaining capacity} = (2000 \times 97/100 - 400)$$

$$= 1540 \text{ mAh}$$

Further, in the first embodiment, a remaining capacity of 0 mAh is determined when the battery is discharged with a capacity of 1440 mAh for a temperate of −20° C., whereas in the related art, a remaining capacity of 500 mAh is determined.

The remaining capacity may be an absolute value expressed in milliamps per hour (mAh), or may be a relative remaining capacity represented by a ratio (%) of the remaining capacity relative to a certain capacity as given by:

$$\text{Relative remaining capacity} = \text{remaining capacity}/\text{total capacity} \times 100 \quad \text{Eq. (2)}$$

While the discharge efficiencies shown in FIGS. 6 and 7 are power-dependent, an averaged output voltage of the battery cells 202a and 202b may be calculated, and current may be used instead of power. The remaining capacity or relative remaining capacity may be determined from the relationship between the discharge efficiency and the current. In this case, the current detector 205 may not be provided in the battery pack 200. The relationship between the power consumption and the time shown in FIG. 2 is further replaced by the relationship between the current and the time.

In step S1205 shown in FIG. 5, the remaining capacity determined in step S1204 is compared with the remaining capacity (min) stored in the battery microcomputer 206. If the remaining capacity is smaller than the remaining capacity (min), the process proceeds to step S1220; otherwise, the process proceeds to step S1206. In step S1002 shown in FIG. 3, the remaining capacity (min) may be cleared to a value that allows the process to proceed to step S1206 in the first determination of step S1205 after the clear processing, such as the total capacity (i.e., remaining capacity (min)=total capacity).

In step S1206, the remaining capacity (min) is set as the remaining capacity determined in step S1204, and the process proceeds to S1207. In step S1220, the remaining capacity (mim) is set as the remaining capacity. Then, the process proceeds to step S1207. In step S1207, the remaining capacity calculation subroutine ends.

The first embodiment achieves numerous advantages which are herein discussed below.

(1) According to the first embodiment, if discharge power calculated based on a detected current value is smaller than expected maximum power PM1 (specified power value), which is the maximum power expected in an actual operation, the following operation is performed. That is, remaining capacity calculation is performed (step S1204 shown in FIG. 5) using the discharge efficiency at the expected maximum power PM1 (steps S1202 and S1210 shown in FIG. 5). This ensures that a remaining battery capacity based on power required for a photographing operation can be detected. In an apparatus with large changes in power, such as a camera, therefore, for example, if a remaining battery capacity is detected when the power is small before a photographing operation is started, an accurate remaining capacity that ensures the operation of the apparatus when the power is large after the photographing operation has been started can be displayed.

(2) Even when the discharge power calculated based on the detected current value becomes greater than or equal to the expected maximum power PM1 (in steps S1202 and S1203 shown in FIG. 5), a remaining capacity can be detected in accordance with the discharge efficiency for the temperature and power obtained when the remaining capacity is detected.

(3) In a remaining-battery-capacity detection operation, a remaining battery capacity based on power required for a photographing operation can be detected. Therefore, even if it is determined in use that there is no remaining capacity and thereafter the same battery is attached again, it is not erroneously determined that battery life seems to return.

(4) In a remaining-battery capacity detection operation, a remaining battery capacity based on power required for a photographing operation can be detected. Therefore, a further advantage is achieved. That is, even if the interval of communication for remaining capacity checks performed by the camera microcomputer 102 with respect to the battery microcomputer 206 is too long to detect a remaining capacity at the maximum power point, an accurate remaining capacity that ensures the operation of the apparatus when the power is large can be detected.

Second Exemplary Embodiment

In the description of a second embodiment of the present invention, a change of the above-described expected maximum power, which is the maximum power expected in an actual operation, depending on various setting modes of the camera is taken into account.

A camera of the second embodiment has a structure similar to that of the first embodiment shown in FIG. 1. In the second embodiment, the camera body 100 in the structure shown in FIG. 1 includes a setting switch (not shown) for setting a subsequent mode. That is, any of the following autofocus (AF) setting modes is set: a one-shot AF mode that is a mode in which the lens is stopped when the lens is focused, and a servo AF mode that is a mode in which the lens is continuously focused for a period during which the release switch is pressed.

When the one-shot AF mode is set, the relationship between the operation and the power consumption shown in FIG. 2, which is the same as that of the first embodiment, is obtained. When the servo AF mode is set, the relationship shown in FIG. 8 between the operation and the power consumption according to the second embodiment is obtained. The basic flow of operation is similar to that of the first embodiment described with reference to FIG. 2, and a difference therebetween will be described.

The relationship between the camera operation and the power consumption according to the second embodiment, which is different from the first embodiment, will now be described with reference to FIGS. 8, 9, and 10.

Figure 8:
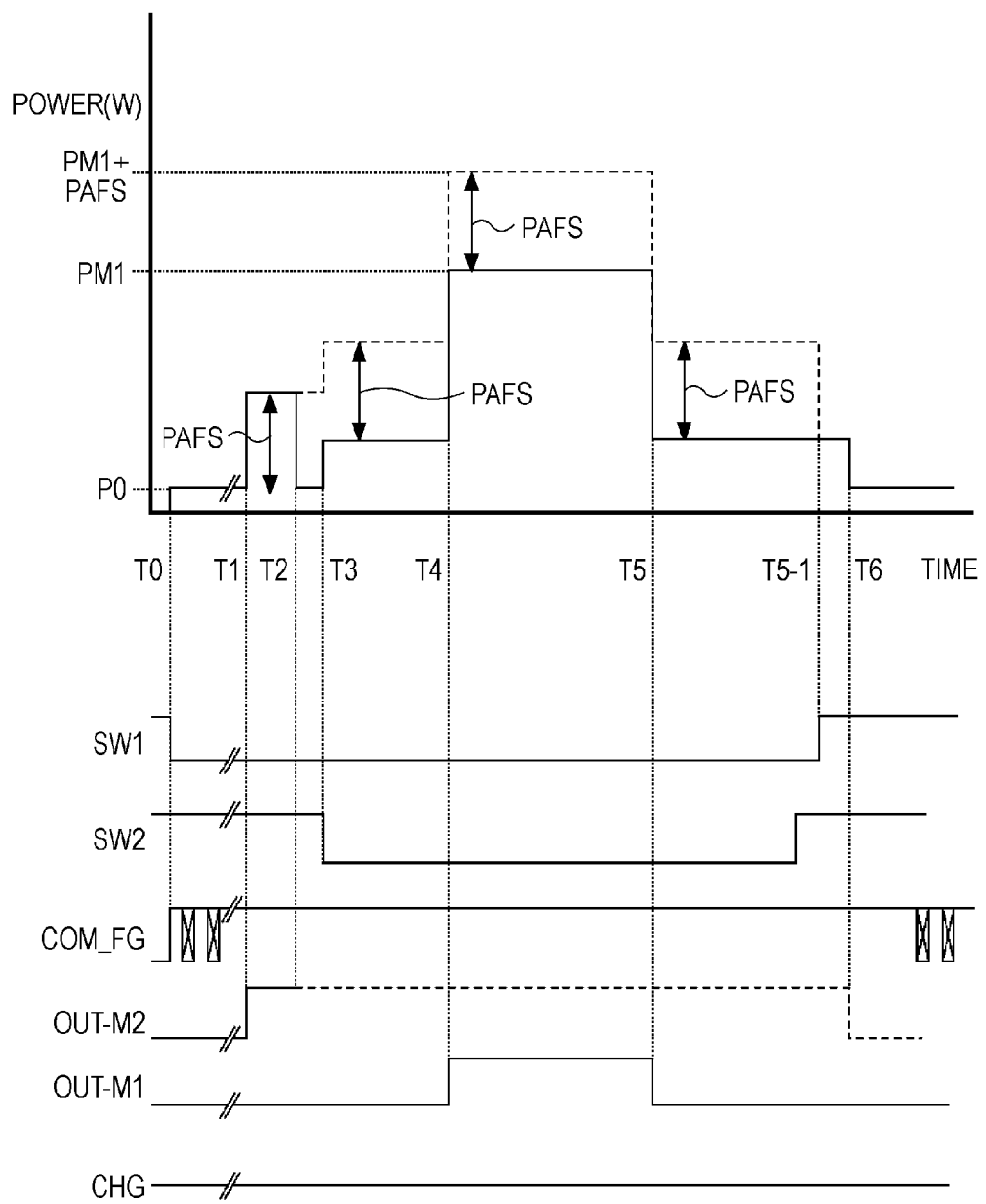
FIG. 8 is a time chart showing a first operation of a camera according to a second embodiment of the present invention.

FIG. 8 is a time chart showing a first operation of the camera according to the second embodiment. FIG. 8 shows a relationship between the operation and the power consumption when the release switch is being pressed.

During the depression of the release switch, the lens microcomputer 302 continuously drives the lens by means of the motor M2. That is, the lens is continuously driven for a period from time T0 to time T5-1 shown in FIG. 8.

The power consumption increases by an amount corresponding to an amount of drive power PAFS of the motor M2, and expected maximum power to be transmitted from the camera microcomputer 102 to the battery microcomputer 206 is given by PM1+PAFS. The expected maximum power is power estimated during a period from time T4 to time T5, and is transmitted from the camera microcomputer 102 to the battery microcomputer 206 for a period from time T0 to time T1.

Figure 9:
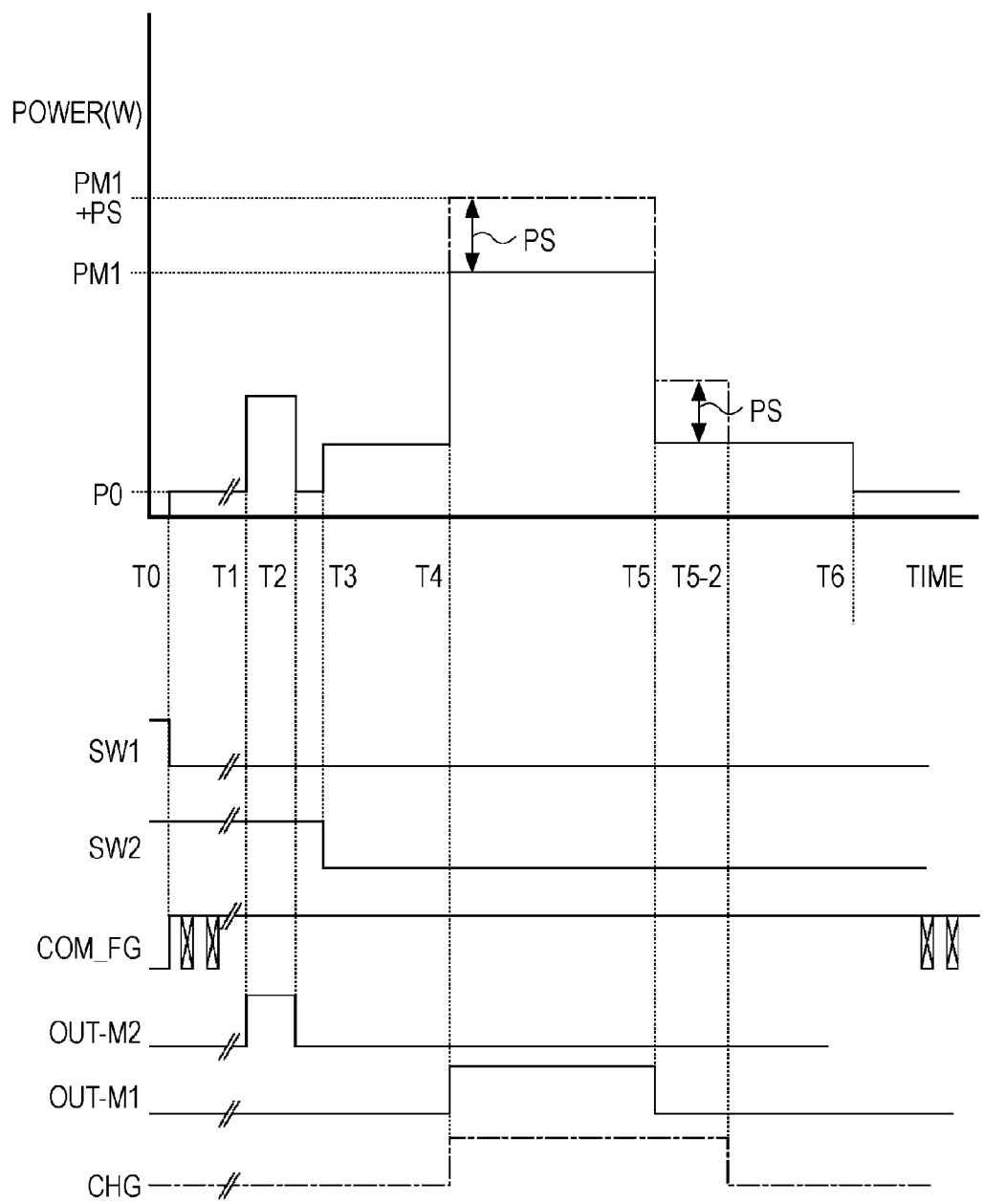
FIG. 9 is a time chart showing a second operation of the camera according to the second embodiment.

FIG. 9 is a time chart showing a second operation of the camera according to the second embodiment. FIG. 9 shows an example in which a relationship between the operation and the power consumption when the one-shot AF mode is set and when illumination using a built-in strobe system (including the voltage-boosting circuit 107, capacitor 108, and flashlight device 109 shown in FIG. 1) is set. In the following description, it is assumed that electric charges have been charged in the capacitor 108 before the start of a photographing operation.

Referring to FIG. 9, the camera microcomputer 102 sets the signal level of the terminal CHG to the high level for a period from time T4 to time T5-2 after the end of a photographing operation, and enables the voltage-boosting circuit 107 to charge the capacitor 108 before the start of a next photographing operation.

The power consumption increases by a power value PS corresponding to a charging operation, and expected maximum power to be transmitted from the camera microcomputer 102 to the battery microcomputer 206 is given by PM1+PS. The expected maximum power is power estimated during the period from time T4 to time T5, and is transmitted from the camera microcomputer 102 to the battery microcomputer 206 for the period from time T0 to time T1.

Figure 10:
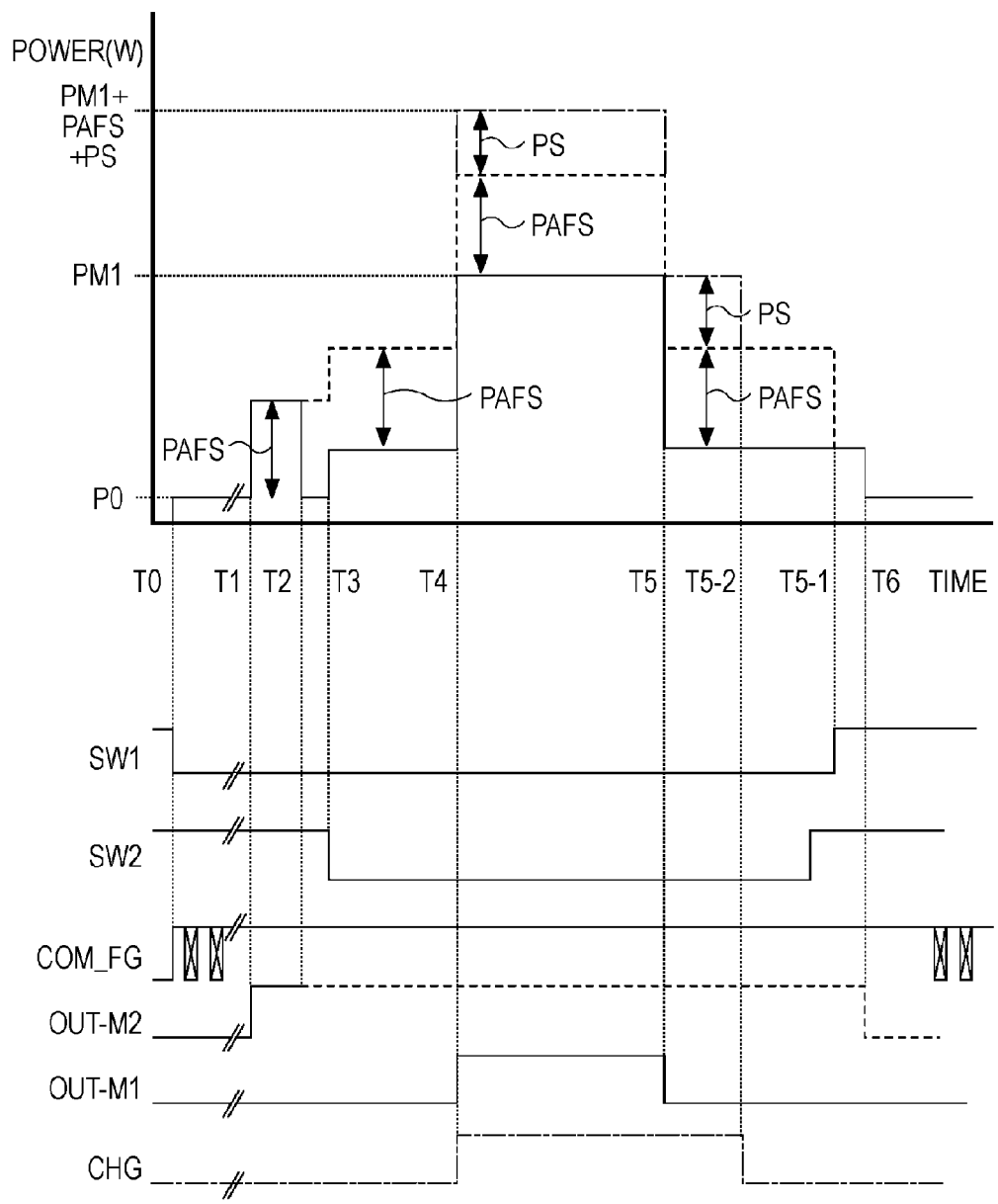
FIG. 10 is a time chart showing a third operation of the camera according to the second embodiment.

FIG. 10 is a time chart showing a third operation of the camera according to the second embodiment. In particular, FIG. 10 shows an example in which a relationship between the operation and the power consumption when the servo AF mode is set and when illumination using the built-in strobe system is set.

The basic flow of operation is similar to that of the example shown in FIG. 8. In the example shown in FIG. 10, the power consumption during the driving of the motor 105 for the period from time T4 to time T5 increases by the power consumption PAFS of the motor M2 and the power PS corresponding to a charging operation of the voltage-boosting circuit 107.

Thus, expected maximum power to be transmitted from the camera microcomputer 102 to the battery microcomputer 206 is given by PM1+PS+PAFS. The expected maximum power is power estimated during the period from time T4 to time T5, and is transmitted from the camera microcomputer 102 to the battery microcomputer 206 for the period from time T0 to time T1.

According to the second embodiment, a change of expected power depending on the set mode of the camera is taken into account, and expected maximum power corresponding to the set mode of the camera is transmitted from the camera microcomputer 102 to the battery microcomputer 206. Therefore, the advantages of the first embodiment described above can be more effectively provided.

In case of a change of the maximum power of the camera body 100 depending on the temperature, humidity, input voltage, etc., expected maximum power may be determined accordingly and may be transmitted from the camera microcomputer 102 to the battery microcomputer 206. Therefore, the advantages of the first embodiment described above can be further effectively be provided.

Third Exemplary Embodiment

In the description of a third embodiment of the present invention, a change of the above-described expected maximum power, which is the maximum power expected in an actual operation, depending on the lens type is taken into account.

A camera of the third embodiment has a structure similar to that of the first embodiment. The relationship between the operation of the camera and the power consumption according to the third embodiment, which is different from the first and second embodiments, will now be described with reference to FIG. 11.

Figure 11:
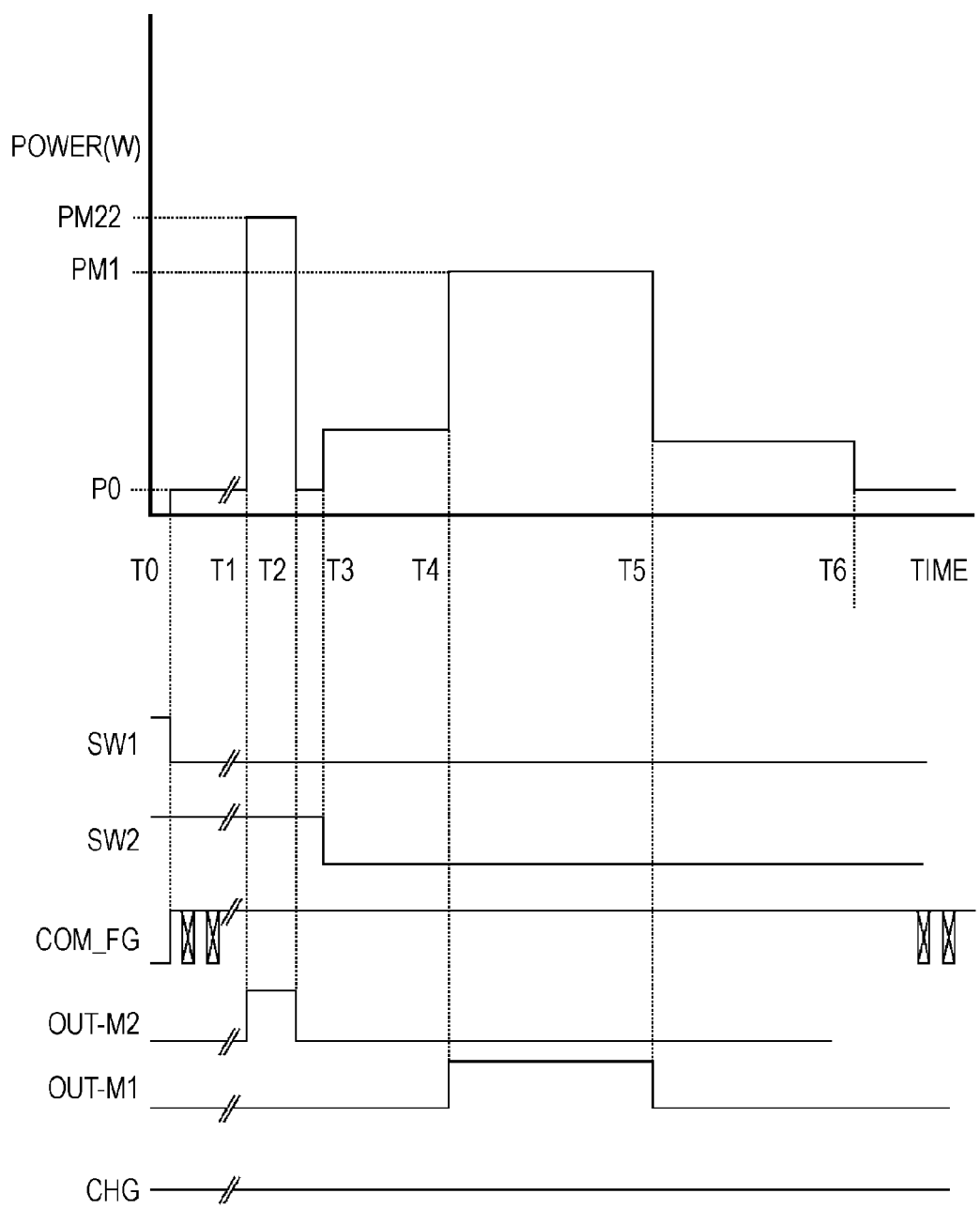
FIG. 11 is a time chart showing the operation of a camera according to a third embodiment of the present invention.

FIG. 11 is a time chart showing the operation of the camera according to the third embodiment, and shows a relationship among signals of the camera microcomputer 102 and the lens microcomputer 302 to be supplied for a period from the start of the camera and to the end of a photographing operation, the power consumption, and the time.

In FIG. 11, which shows a relationship between the operation of the camera according to the third embodiment and the power consumption, the basic flow is similar to that of the first embodiment described with reference to FIG. 2, and a difference therebetween will now be described.

The load on the motor M2 is different depending on the type of the lens unit 300. That is, in the example shown in FIG. 11, there may be a case where the relationship between power consumption PM22 during the driving of the lens for a period from time T1 to time T2 and power consumption PM1 during the driving of the motor 105 for a period from time T4 to time T5 satisfies the following expression:

PM22>PM1

In this case, the value PM22, which is estimated during the period from time T1 to time T2, is transmitted as expected maximum power from the camera microcomputer 102 to the battery microcomputer 206 for a period from time T0 to time T1. The value PM22 is stored by the camera microcomputer 102 by communicating with the lens microcomputer 302 to, for example, identify the ID of the lens unit 300. Alternatively, the value PM22 may be stored in a storage unit (not shown), or may be stored in the lens microcomputer 302 or a storage unit (not shown) in the lens unit 300.

According to the third embodiment, a change of expected maximum power depending on the lens type is taken into account, and expected maximum power corresponding to the type of a lens is transmitted from the camera microcomputer 102 to the battery microcomputer 206. Therefore, the advantages of the first embodiment described above can be more effectively provided.

Fourth Exemplary Embodiment

In the description of a fourth embodiment of the present invention, a change of the above-described expected maximum power depending on a camera accessory such as a hard disk device, a flashlight device, or a lighting device is taken into account.

A camera of the fourth embodiment has a structure similar to that of the first embodiment. The relationship between the operation of the camera and the power consumption according to the fourth embodiment, which is different from the first, second, and third embodiments, will now be described with reference to FIG. 12.

Figure 12:
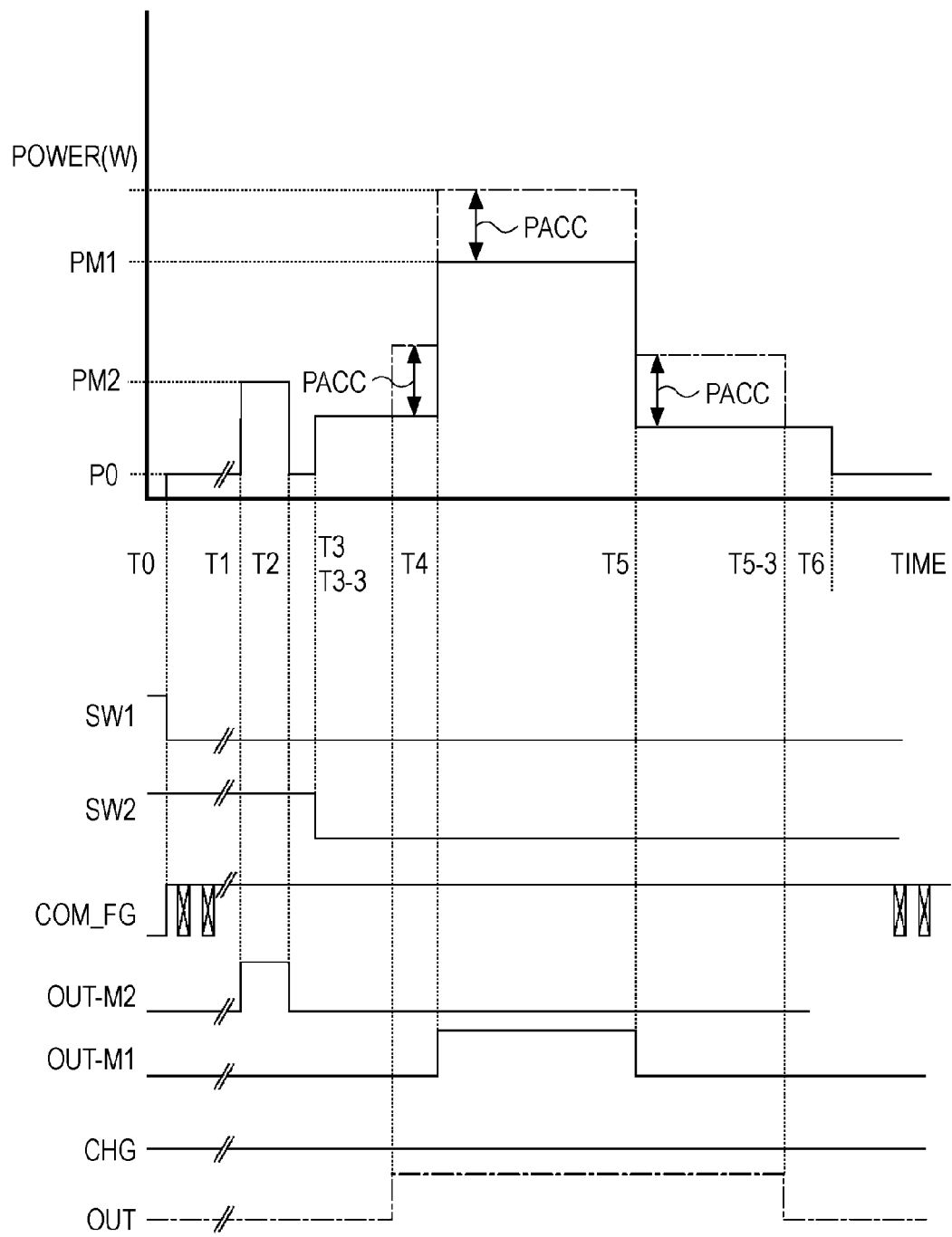
FIG. 12 is a time chart showing the operation of a camera according to a fourth embodiment of the present invention.

FIG. 12 is a time chart showing the operation of the camera according to the fourth embodiment, and shows a relationship among signals of the camera microcomputer 102 and the lens microcomputer 302 to be supplied for a period from the start of the camera and to the end of a photographing operation, the power consumption, and the time.

In the structure shown in FIG. 1, an HDD is connected as the accessory 400 by way of example. The basic flow of operation is similar to that of the example shown in FIG. 2. In the example shown in FIG. 12, the power consumption for a period from time T3-3 to time T5-3 increases by power PACC corresponding to the driving of a disk of the HDD serving as the load unit 403 and the writing of data.

Thus, expected maximum power to be transmitted from the camera microcomputer 102 to the battery microcomputer 206 is given by PM1 +PACC. The expected maximum power is power estimated during a period from time T4 to time T5, and is transmitted from the camera microcomputer 102 to the battery microcomputer 206 for a period from time T0 to time T1.

The power PACC is stored by the camera microcomputer 102 by communicating with the accessory microcomputer 402 to, for example, identify the ID of the accessory 400. Alternatively, the power PACC may be stored in a storage unit (not shown), or may be stored in the accessory microcomputer 402 or a storage unit (not shown) in the accessory 400.

According to the fourth embodiment, a change of expected maximum power depending on a camera accessory is taken into account, and expected maximum power corresponding to the type of an accessory is transmitted from the camera microcomputer 102 to the battery microcomputer 206. Therefore, the advantages of the first embodiment described above can be more effectively provided.

Fifth Exemplary Embodiment

A fifth embodiment of the present invention provides a remaining-battery-capacity detection operation of the battery microcomputer 206, and calculation of remaining battery capacity by the camera body 100, which are different from those of the first embodiment.

A camera of the fifth embodiment has the same or similar structure as that of the first embodiment, and the operation of the camera and the operating power are the same as those of the first embodiment described with reference to FIG. 2. The remaining-battery-capacity detection operation of the battery microcomputer 206 and calculation of remaining battery capacity by the camera body 100, which are different from those of the first embodiment described above, will be described.

The remaining-battery-capacity detection operation of the battery microcomputer 206 will now be described. As in the first embodiment, the battery microcomputer 206 calculates discharge power from the voltage of the battery cells 202a and 202b detected by the current detector 205 and the current detected by the current detecting resistor 203 and the current detector 204, and determines a discharge efficiency like that shown in FIG. 7. A remaining capacity is determined by Eq. (1) from the discharge efficiency.

Further, the total battery capacity, the voltage, current, and temperature of the battery cells 202a and 202b detected by the battery microcomputer 206, and the calculated remaining capacity (hereinafter referred to as "remaining capacity BAT") are transmitted to the camera microcomputer 102 for a period from time T0 to time T1 shown in FIG. 2.

The calculation of remaining battery capacity of the camera will now be described. In the fifth embodiment, the camera microcomputer 102 performs a calculation below for the period from time T0 to time T1 shown in FIG. 2 based on the voltage, current, and temperature of the battery cells 202a and 202b, and the remaining capacity BAT, which are received from the battery microcomputer 206.

First, the camera microcomputer 102 calculates power consumption PNOW from the voltage and current of the battery cells 202a and 202b. Further, the camera microcomputer 102 compares the expected maximum power PM1 stored in the camera microcomputer 102 or the storage unit (not shown) with the power consumption PNOW. If the power consumption PNOW is greater than or equal to the expected maximum power PM1, the remaining capacity BAT received from the battery microcomputer 206 is displayed as a remaining capacity (hereinafter referred to as "remaining capacity C") on the display unit 103.

If the power consumption PNOW is smaller than the expected maximum power PM1, a discharge efficiency DE(PNOW) at the power value PNOW and a discharge efficiency DE(PM1) at the power value PM1 are determined from a table showing the relationship between the discharge current and temperature of the battery cells 202a and 202b and the discharge efficiency (see FIG. 7). Then, the remaining capacity C is calculated by the following equation:

$$\text{Remaining capacity } C = \text{remaining capacity BAT} - \text{total capacity} \times (\text{discharge efficiency DE(PM1)} - \text{discharge efficiency DE(PNOW)})/100 \quad \text{Eq. (3)}$$

As with the battery microcomputer 206, a discharge efficiency is determined by the camera microcomputer 102 using an existing calculation method by referring to a table of power and temperature or using a function.

For example, it is assumed that the temperature is −20° C., the total capacity is 2000 mAh, the discharge capacity is 400 mAh, the P0 indicates a power of 1 W, and the value PM1 indicates a power of 12 W. In this case, referring to the discharge efficiency characteristics shown in FIG. 7, the discharge efficiency at a power of 12 W is determined to be 72% and the discharge efficiency at a power of 1 W is determined to be 97%.

The battery microcomputer 206 transmits the remaining capacity BAT given by:

$$\text{Remaining capacity } BAT = (2000 \times 97/100 - 400)$$
$$= 1540 \text{ mAh}$$

The camera microcomputer 102 calculates the remaining capacity C by:

$$\text{Remaining capacity } C = \text{remaining capacity } BAT - \text{total capacity} \times$$
$$(\text{discharge efficiency } DE(PNOW) -$$
$$\text{discharge efficiency } DE(PM1))/100$$
$$= 1540 \text{ mAh} - 2000 \text{ mAh} \times (97 - 72)/100$$
$$= 1040 \text{ mAh}$$

As in the first embodiment, the remaining capacity C is a remaining capacity having a constant discharge efficiency at the power PM1 under power consumption less than PM1, that is, power lower than or equal to the value PM1 shown in FIG. 6.

Further, as in the first embodiment, the remaining capacity may be an absolute value expressed in mAh, or may be a relative remaining capacity represented by a ratio (%) of the remaining capacity relative to a certain capacity as given by Eq. (2).

The remaining-battery-capacity detection operation of the battery microcomputer 206 and the method for calculating the remaining battery capacity by the camera body 100 according to the fifth embodiment can also achieve advantages similar to those of the first embodiment described above.

Other Exemplary Embodiments

While the foregoing embodiments have been described in the context of a camera, the present invention can be effectively used for apparatuses with large changes in power depending on the operation state, other than cameras, in particular, apparatuses having a wide use temperature range.

The advantages of the present invention can also be achieved by executing the following processing. That is, a storage medium having recorded thereon program code of software implementing the functions of the foregoing embodiments is supplied to a system or an apparatus, and a computer (or a central processing unit (CPU) or a microprocessing unit (MPU)) of the system or apparatus reads and executes the program code stored in the storage medium.

In this case, the program code read from the storage medium achieves the functions of the foregoing embodiments. The program code and the storage medium storing the program code may constitute embodiments of the present invention.

Examples of a storage medium for supplying the program code may include a floppy disk, a hard disk, an optical disk, a magneto-optical disk, a compact disk read-only memory (CD-ROM), a CD readable (CD-R) disk, a CD rewritable (CD-RW) disk, a digital versatile disk ROM (DVD-ROM), a DVD rewritable (DVD-RW) disk, a DVD+RW disk, a magnetic tape, a non-volatile memory card, and a ROM. The program code may be downloaded via a network.

According to an embodiment of the present invention, the program code read by the computer may be executed to achieve the functions of the foregoing embodiments. In addition, according to other embodiments of the present invention, an operating system (OS) or the like running on the computer may execute part of or the entirety of actual processing according to the instruction of the program code to achieve the functions of the foregoing embodiments.

In further embodiments of the present invention, the functions of the foregoing embodiments may be achieved by the following processes. The program code read from the storage medium is written in a memory of a function extension board placed in the computer or a function extension unit connected to the computer, and thereafter a CPU or the like of the function extension board or the function extension unit executes part of or the entirety of actual processing according to the instruction of the program code.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2007-025531 filed Feb. 5, 2007, which is hereby incorporated by reference herein in its entirety.

What is claimed is:

1. A battery pack comprising:
a first detecting unit that detects a remaining capacity of a battery pack by using a first discharge efficiency if a discharge power of the battery pack is smaller than a predetermined power,
wherein the first discharge efficiency is detected by using the predetermined power and a temperature of the battery pack; and
a second detecting unit that detects a remaining capacity of the battery pack by using a second discharge efficiency if the discharge power is not smaller than the predetermined power, wherein the second discharge efficiency is detected by using the discharge power and the temperature of the battery pack.

2. The battery pack according to claim 1, wherein the predetermined power includes an expected consumption power relating to an electronic apparatus if the electronic apparatus and the battery pack are connected.

3. The battery pack according to claim 1, wherein the predetermined power includes a power relating to an operation mode of an electronic apparatus if the electronic apparatus and the battery pack are connected.

4. The battery pack according to claim 1, wherein the predetermined power includes a power relating to an external apparatus if an electronic apparatus is connected to the battery pack and the electronic apparatus is connected to the external apparatus.

5. The battery pack according to claim 4, wherein the external apparatus includes at least one of a hard disk device, a flashlight device, and a lighting device.

6. The battery pack according to claim 1, wherein an electronic apparatus includes a motor, and the predetermined power includes a power relating to a state of the motor if the electronic apparatus and the battery pack are connected.

7. The battery pack according to claim 1, wherein the predetermined power includes a power relating to a state of an electronic apparatus if the electronic apparatus and the battery pack are connected.

8. An electronic apparatus comprising:
a detecting unit that detects a second remaining capacity of a battery pack by using a first discharge efficiency and a second discharge efficiency if a consumption power of the electronic apparatus is smaller than a predetermined power, wherein the first discharge efficiency is detected by using the predetermined power and a temperature of the battery pack, and the second discharge efficiency is detected by using the consumption power and the temperature of the battery pack; and
a control unit that causes a display unit to display information indicating a first remaining capacity if the consumption power is not smaller than the predetermined power, wherein the first remaining capacity is obtained from the battery pack.

9. The electronic apparatus according to claim 8, wherein the predetermined power includes an expected consumption power relating to the electronic apparatus if the electronic apparatus and the battery pack are connected.

10. The electronic apparatus according to claim 8, wherein the electronic apparatus includes a motor, and the predetermined power includes a power relating to a state of the motor if the electronic apparatus and the battery pack are connected.

11. The electronic apparatus according to claim 8, further comprising: an obtaining unit that obtains the first remaining capacity from the battery pack.

12. The electronic apparatus according to claim 11, wherein the obtaining unit obtains a temperature detected by the battery pack.

13. The electronic apparatus according to claim 8, wherein the predetermined power includes a power relating to a state of the electronic apparatus if the electronic apparatus and the battery pack are connected.

14. The electronic apparatus according to claim 8, wherein the electronic apparatus includes an apparatus for displaying an image.

15. The electronic apparatus according to claim 8, wherein the electronic apparatus includes an image capture apparatus.

16. A non-transitory computer-readable storage medium storing a program executed by a computer to perform a control method, the control method comprising:
detecting a remaining capacity of a battery pack by using a first discharge efficiency if a discharge power of the battery pack is smaller than a predetermined power, wherein the first discharge efficiency is detected by using the predetermined power and a temperature of the battery pack; and
detecting a remaining capacity of the battery pack by using a second discharge efficiency if the discharge power is not smaller than the predetermined power, wherein the second discharge efficiency is detected by using the discharge power and the temperature of the battery pack.

17. A non-transitory computer-readable storage medium storing a program by a computer to perform a control method, the control method comprising:
detecting a second remaining capacity of a battery pack by using a first discharge efficiency and a second discharge efficiency if a consumption power of an electronic apparatus is smaller than a predetermined power, wherein the first discharge efficiency is detected by using the predetermined power and a temperature of the battery pack, and the second discharge efficiency is detected by using the consumption power and the temperature of the battery pack; and
causing a display unit to display information indicating a first remaining capacity if the consumption power is not smaller than the predetermined power, wherein the first remaining capacity is obtained from the battery pack.

* * * * *